United States Patent [19]

Bright et al.

[11] 4,346,952
[45] Aug. 31, 1982

[54] CONNECTOR FOR A CERAMIC SUBSTRATE

[75] Inventors: Edward J. Bright, Elizabethtown; David A. Kaplon, Harrisburg; William S. Scheingold, Palmyra, all of Pa.

[73] Assignee: AMP Incorporated, Harrisburg, Pa.

[21] Appl. No.: 159,429

[22] Filed: Jun. 16, 1980

[51] Int. Cl.³ .............................................. H01R 9/09
[52] U.S. Cl. .................................. 339/17 CF; 339/174
[58] Field of Search ............................ 339/17 CF, 174; 179/52 FP

[56] References Cited

U.S. PATENT DOCUMENTS

| | | | |
|---|---|---|---|
| 3,754,203 | 8/1973 | Pauza et al. | 339/17 CF |
| 3,805,212 | 8/1974 | Candman et al. | 339/17 CF |
| 3,846,737 | 11/1974 | Spaulding | 339/17 CF X |
| 3,877,064 | 4/1975 | Scheingold et al. | 339/17 CF X |
| 4,052,118 | 10/1977 | Scheingold et al. | 339/17 CF |

FOREIGN PATENT DOCUMENTS 2008333  5/1979  United Kingdom .......... 339/17 CF

Primary Examiner—Eugene F. Desmond
Attorney, Agent, or Firm—Allan B. Osborne

[57] ABSTRACT

The present invention relates to a connector for holding a ceramic substrate and for electrically connecting its circuits to a printed circuit board. More particularly, the connector includes a housing containing a plurality of cells, contact carrying spring members positioned in the cells and a cover which loads the substrate against spring members. The spring members have a pin for insertion into a printed circuit board and a preloaded upper section for substrate engagement.

2 Claims, 7 Drawing Figures

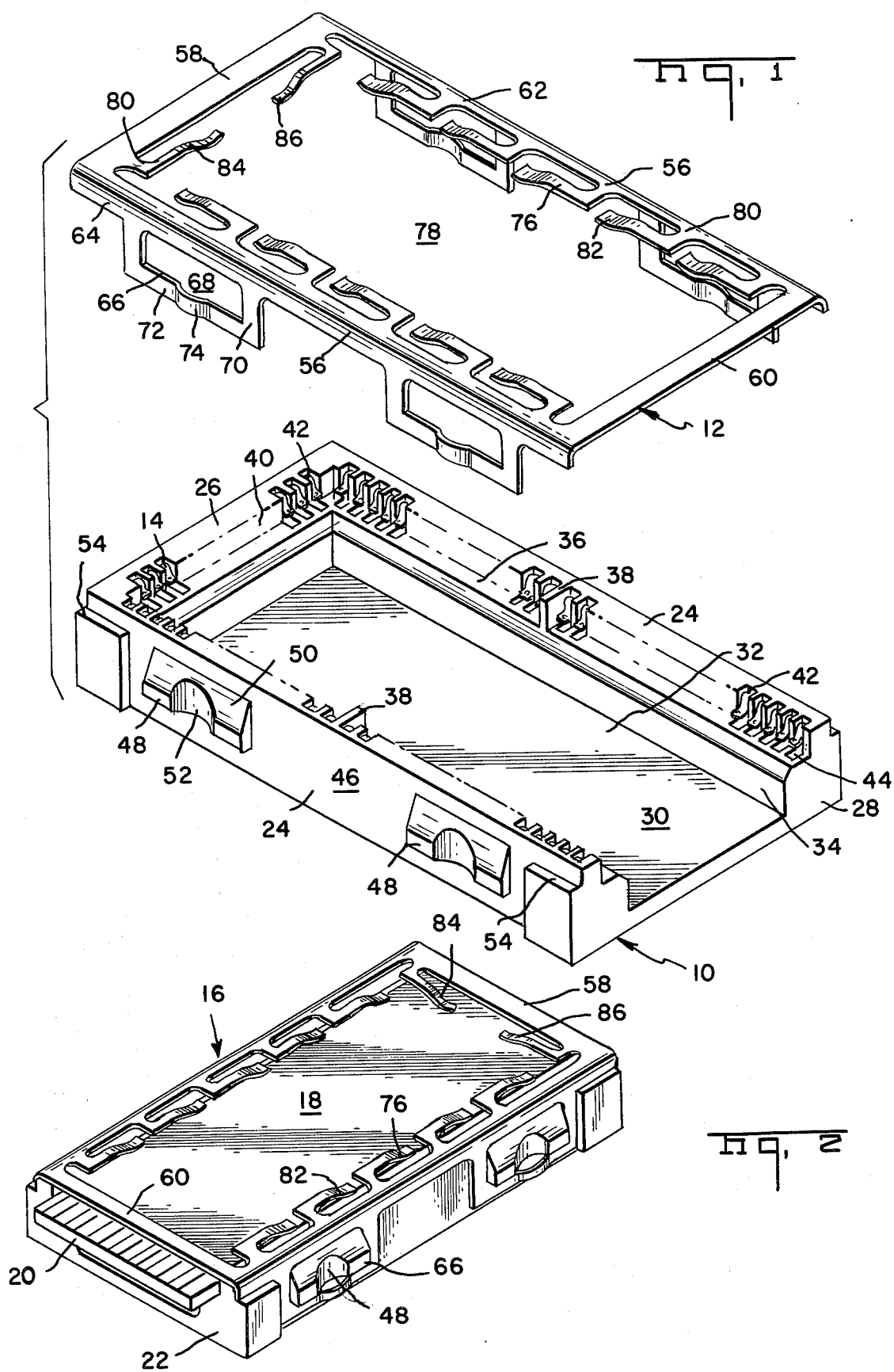

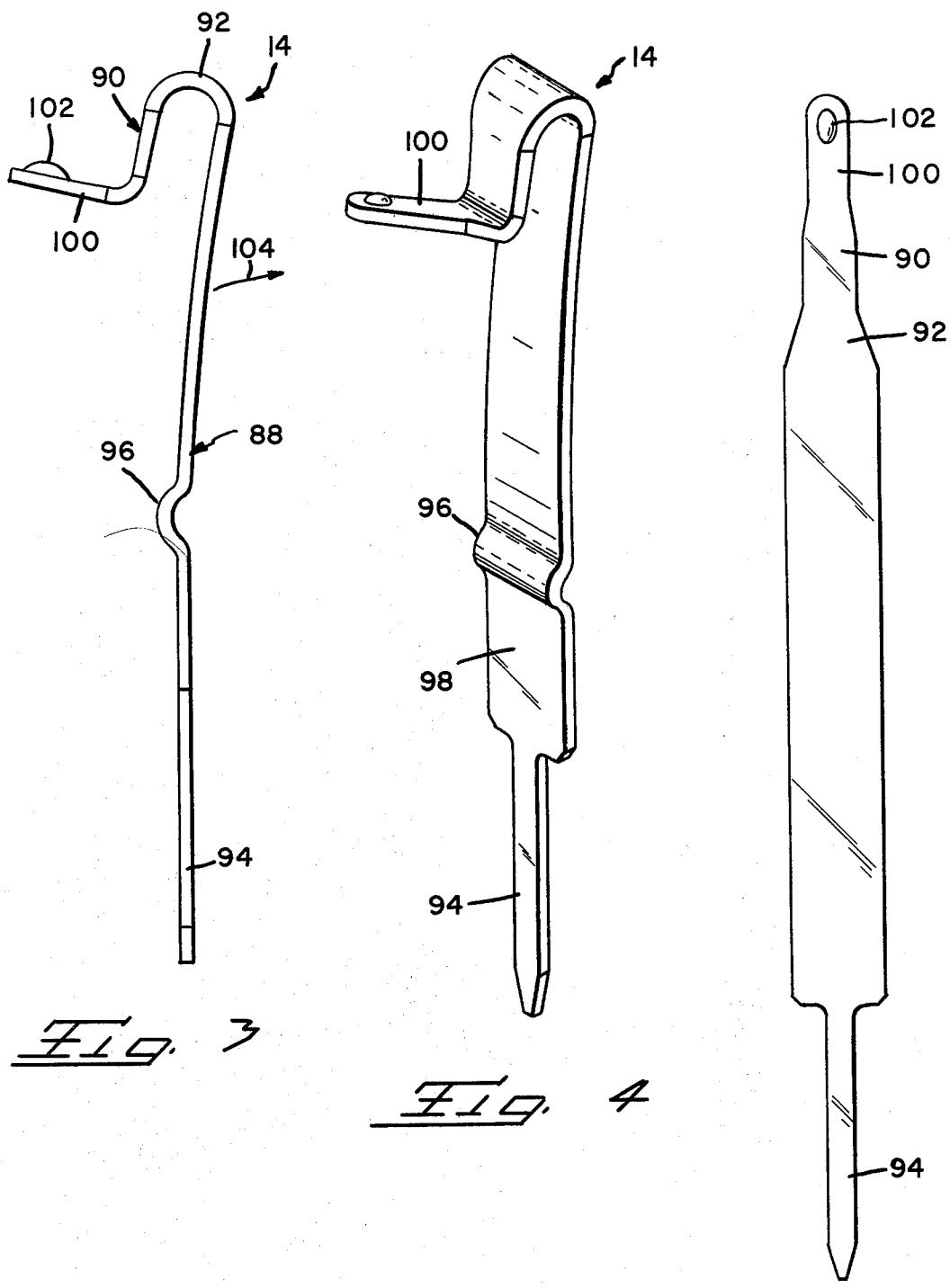

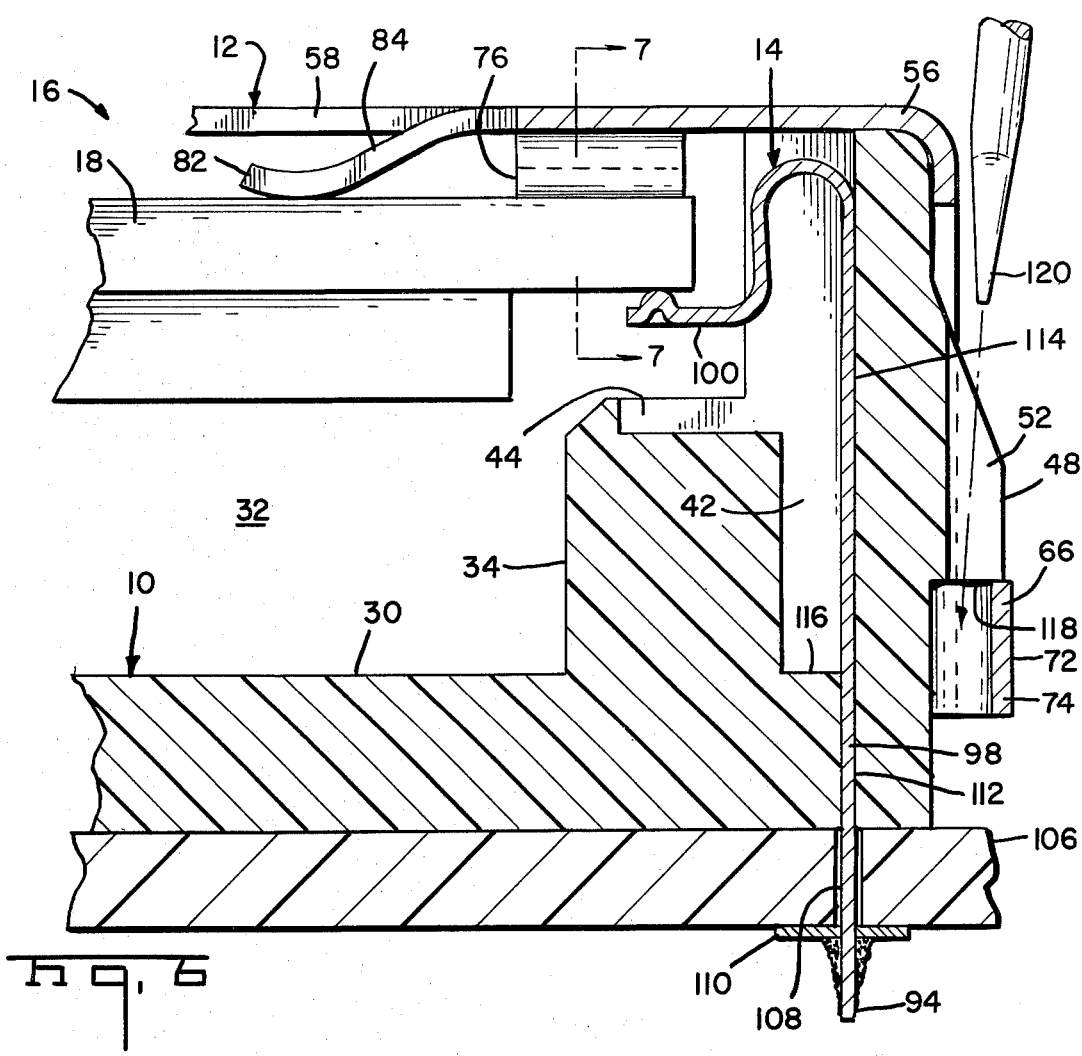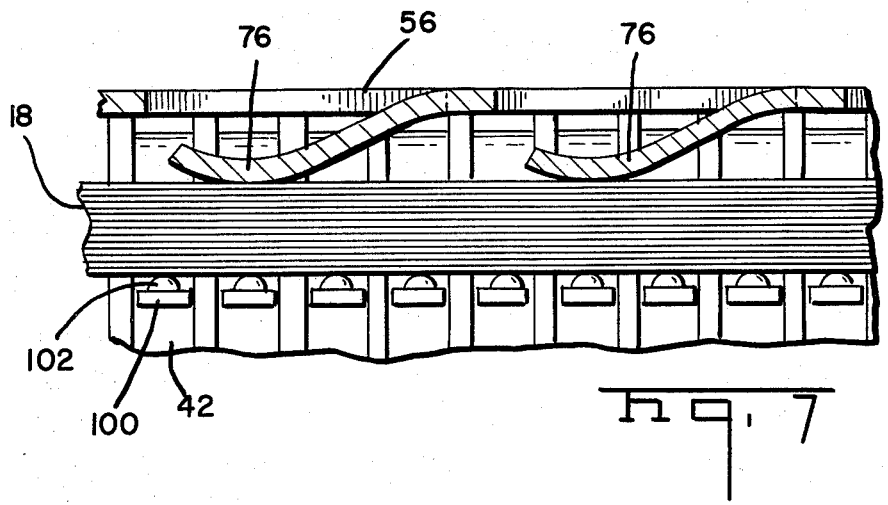

CONNECTOR FOR A CERAMIC SUBSTRATE

BACKGROUND OF THE INVENTION

1. The Field Of The Invention

The present invention relates to connectors of the type having a plurality of contact carrying spring members positioned in an insulating housing into which an active device substrate is positioned with electrical contact being made between pads on the substrate and the spring members. The lower section of the members are adapted for insertion into a printed circuit board. The spring members, stamped and formed from a conductive material, provide an electrical path or conduit between the substrate and board.

2. The Prior Art

Connectors in the prior art include those disclosed in the following U.S. patents:

| U.S. Pat. No. | Patentee | Class/Subclass |
| --- | --- | --- |
| 3,805,212 | Landman et al | 339/17CF |
| 4,052,118 | Scheingold et al | 331/17CF |

Landman et al. teaches a connector wherein the terminal housing is of two, U-shaped supports with the terminals spaced along an elongated side between the two short legs. The terminals are F-shaped with the substrate edge being received between the two laterally extending contacts. In operation, the substrate is placed between the two supports which are then moved towards each other so that the terminals on each support slide onto the opposing edges of the substrate. Cooperating locking elements at the free ends of each short leg fastens the two U-shape supports together, thereby securing the substrate within. Terminal tails on the F-shaped terminals depend from the supports for receipt into a printed circuit board.

Scheingold et al. teaches a connector having a unitized housing wherein terminals or contact carrying spring members are positioned along each side. The substrate is placed into an upwardly opened, central compartment with the pads thereon bearing against the contacts on the upper beam of the spring members. Conventional clamps hold the substrate in the housing and against the spring members. The lower beam on the spring members have a contact thereon for surface-to-surface electrical engagement with the traces on the printed circuit board.

SUMMARY OF THE INVENTION

The present invention teaches a connector for mounting a ceramic substrate to a printed circuit board. The housing of the connector is adapted to receive a substrate of the type having pads on three edges with a fourth edge extending out of the housing for receipt of a card-edge test connector. The housing contains contact carrying spring members along both longitudinal sides and along one end. These spring members are preloaded to limited horizontal travel of the contact arm thereon during engagement with the substrate. The spring member is U-shaped asymmetrically with the lower part of an elongated first leg being adapted for insertion into a printed circuit board. The second, much shorter leg has its free end bent around to form the aforementioned laterally extending contact arm.

The present invention further includes a hold-down frame having integral, cantilever springs to exert force on the substrate. Further, it has cooperating means for being latched onto the housing. The springs push the substrate against the contact arms to establish good electrical contact therebetween.

BRIEF DESCRIPTION OF THE DRAWINGS

FIG. 1 is a perspective view of the housing and hold-down frame of the present invention;

FIG. 2 shows the housing and hold-down frame of FIG. 1 assembled into a connector with a substrate secured therein;

FIGS. 3 and 4 are perspective views of a spring member of the present invention;

FIG. 5 illustrated the blanked out but unformed spring member of FIGS. 3 and 4;

FIG. 6 is a cross-sectional side view of a portion of the assembly of FIG. 2; and FIG. 7 is a view taken along line 7—7 of FIG. 6.

DETAILED DESCRIPTION OF THE PRESENT INVENTION

FIG. 1 illustrates housing 10 and hold-down frame 12 of the present invention. Contact carrying spring members 14 are positioned in the housing but are seen indistinctly. FIG. 2 illustrates connector 16 which comprises housing 10, frame 12, and spring members 14. A substrate 18 is positioned and secured in the connector. Note that one edge of the substrate, designated by reference numeral 20, extends out of end 22 of the connector and that that edge is adapted to receive a test connector or card edge connector (neither of which are shown).

The housing as shown in FIG. 1 has two longitudinal side walls 24 and one end wall 26. The opposite end of the housing, designated by reference numeral 28, is opened.

The three walls and floor 30 of the housing defines an upwardly open compartment 32 into which substrate 18 may be positioned.

The inside surface of side walls 24, indicated generally by reference numeral 34, has an upwardly facing ledge 36 positioned about half way between the top of the wall and the floor. A rib 38 is located on both inside surfaces midway between the two ends. The ribs provide accurate positioning of the substrate which has cooperating slots on both sides. Such positioning devices allow closer spacing of pads on the substrate and contact-bearing spring members in the connector.

Inside surface 40 of end wall 26 also has a ledge 36.

Both side walls 24 and end wall 26 have vertically-extending cells 42 positioned along the lengths thereof. These cells open out on the top of the walls as well as on the inside surfaces above the ledge. Cavities 44 are provided in the ledges in alignment with and connected to each cell 42. FIG. 6 shows the cell and cavity structure clearly.

Exterior surfaces 46 of side walls 24 each have two spaced apart ears 48. These laterally projecting ears have a bevelled upper surface 50 and a vertical groove 52.

The outside ends of side walls 24 have an increase in thickness to provide an upwardly facing shoulder 54 which serves as a stop for hold-down frame 12.

Housing 10 is preferably a one piece molding, using a suitable plastic such as glass filled polypheneylene, oxide.

Hold-down frame 12 is adapted to fit down over housing 10. Its rectangular frame has two side rails 56, a first end rail 58, and a second end rail 60.

Side rails 56 have a horizontal portion 62 and a skirt 64. Two hooks 66 depend from each of the two skirts 64. The hooks have an opening 68 defined by two short sides 70 connected together by a cross-tie 72. The cross-tie has an outwardly projecting bow 74.

A plurality of cantilever springs 76 are positioned along the inside of each horizontal portion 62 on side rails 56. These springs extend into the opening 78 defined by the four rails. Each spring is attached to the horizontal portion 62 by strap 80 with the longitudinal axis of the springs being parallel to the side rails. As viewed from the side, the springs are S-shaped, curving downwardly from the strap to the free end 82 which curves upwardly. Although the drawing shows the springs facing in the same direction, other arrangements would be acceptable.

End rail 58 has two springs 84 which are similarly shaped. They are positioned so their free ends 86 face towards each other.

Hold-down frame 12 is preferably made from 1070 steel.

FIG. 2 shows hold-down frame 12 secured to housing 10 by means of ears 48 on the housing and hooks 66 on the frame. The cross-ties have been cammed over the bevelled surface end then caught under the ears which now stick out through openings 68. FIG. 6 shows the latching in cross-section.

FIGS. 3, 4, and 5 illustrate the contact-carrying spring member 14. FIG. 3 is a side view, FIG. 4 shows the spring member turned partly towards the reader and FIG. 5 shows the member after it has been blanked out but prior to forming.

With reference to FIGS. 3 and 4, the spring member can be seen as being an asymmetrical 'U' with a very long first leg 88 and a short second leg 90. A rounded bight 92 joins the two legs. The lower, free end of the long leg is formed into pin 94 for insertion into a printed circuit board. In the embodiment shown in FIGS. 3 and 4, a jog 96 is formed in leg 88 to provide a stop means in loading the spring member in housing 10. The section of leg 88 between pin 94 and jog 96, indicated by reference numeral 98, fits into a bore in the housing as shown in FIG. 6.

The free end of short leg 90 is bent around ninety degrees to form a forwardly projecting contact arm 100. A contact 102 is impressed in the arm by conventional metal forming techniques.

Spring member 14 is curved rearwardly; i.e., in the direction indicated by arrow 104. The amount of curvature has a preferred radius of about 1.5 inches but can vary from about one inch to about 2.5 inches.

FIG. 5 is a plan view of the blanked out spring member prior to forming. This view shows changes in widths. The widest part is long leg 88 down to pin 94. This portion gives the spring member a very nearly constant stress portion which is desirable in terms of performance.

The decreased width of short leg 90 and contact arm 100 provides resiliency to the spring member.

The preferred material in stamping and forming spring members 14 is phosphor bronze with a tin-lead plating.

FIG. 6 is a cross-section of a segment of connector 16 mounted on a printed circuit board 106. Pin 94, extending through hole 108 in the board, is soldered to form an electrical connection between trace 110 on the board and the spring member.

A bore 112 extends vertically from the underside of housing 10 upwardly to intercept cell 42 and is in alignment with back or outside wall 114 of the cell. The dimensions of the bore are just barely equal to the dimensions of portion 98 on leg 88. The spring members are loaded into cells by inserting them downwardly from the top with pin 94 passing through bore 112 to extend downwardly from the housing. The spring member is positioned when jog 96 abuts against floor 16 of the cell. The interference fit of portion 98 in bore 112 insures a solid placement as well as preventing solder flowing or wicking up the bore and into the housing.

The spring member above jog 96 bears hard against back wall 114 because of the aforementioned curvature, i.e., the member is preloaded against forward travel. Accordingly, as substrate 18 is biased against contact arm 100 there will be some horizontal travel by the upper portion of the spring member and some downward vertical travel by contact arm 100. But with the horizontal travel limited by the pre-loading, the possibility of contact 102 running off the pad (not shown) on the substrate is precluded. Nevertheless, wiping action does occur between the pad and contact for good electrical performance. Cavities 44 provide clearance for contact arms 100; however, the depth of the cavities are limited to prevent the arms from being overstressed.

FIGS. 6 and 7 show springs 84 (FIG. 6 only) and 76 bearing against the top of substrate 18. The multiplicity of the springs on the hold-down frame insure constant and uniform pressure between the substrate pads and contacts 102.

FIG. 6 also shows how ear 48 and hook 66 cooperate to secure the hold-down frame to the housing; i.e., cross-tie 72 is latched on the underside 118 of the ear. Note that bow 74 on the cross-tie is in alignment with groove 52 on the ear. Thus, to unlatch the two, tip 120 of a screwdriver is inserted down the groove in behind the bow and pivoted outwardly to bring the cross-tie out from the underside.

Whereas the connector of the present invention is shown to accept a substrate of the type having one end adapted to extend out of the connector, the housing, spring members and hold-down frame may be modified to accept conventional substrates having pads on all four sides or on only two, opposing sides. The connector may be square as well as the rectangular shape shown. The novel contact-carrying spring members and hold-down frame are quite adaptable to different configurations.

The present invention may be subject to many modifications and changes without departing from the spirit or essential characteristics thereof. The present embodiment is therefore intended in all respects to be illustrative and not restrictive of the scope of the invention.

What is claimed is:

1. An electrical connector for removably mounting a substrate to a printed circuit board with the substrate being of the type having one end adapted to receive thereon a test or card edge connector, said electrical connector comprising:

a. an elongated housing having an open top and an open end through which one end of a substrate may extend and with the side walls, floor and other end wall defining a substrate-receiving cavity, and vertical cells spaced along the inside surfaces of at least the two opposing side walls and further bores extending downwardly through the housing floor from the cells;

b. a plurality of spring members positioned in the cells with a lower end extending through the bores for insertion into a circuit board and an upper end bent back around to form a U-shape with the free end thereof being bent to project laterally into the cavity to provide a contact arm, said spring members being outwardly curved between the upper and lower ends with the amount of curvature being a radius of from about one inch to about two and one-half inches; and c. a hold down frame having biasing means thereon and removably attached to the housing for biasing a substrate which may be positioned in the cavity against the laterally projecting contact arms.

2. The electrical connector of claim 1 wherein the lower end of the spring members include a jog adapted to abut the floor of the cell when the spring members are inserted thereinto.

* * * * *